United States Patent [19]

Peterson et al.

[11] 4,181,249
[45] Jan. 1, 1980

[54] EUTECTIC DIE ATTACHMENT METHOD FOR INTEGRATED CIRCUITS

[75] Inventors: Henry T. Peterson, Irvine; Dennis H. Hawkins, Huntington Beach, both of Calif.

[73] Assignee: Hughes Aircraft Company, Culver City, Calif.

[21] Appl. No.: 828,124

[22] Filed: Aug. 26, 1977

[51] Int. Cl.² ............................................. H01L 25/00
[52] U.S. Cl. ..................................... 228/121; 228/123; 228/124; 29/574; 29/590
[58] Field of Search ................ 228/123, 124, 188, 121; 29/590, 574

[56] References Cited

U.S. PATENT DOCUMENTS

| | | | |
|---|---|---|---|
| 3,235,943 | 2/1966 | Marafioti | 228/121 X |
| 3,680,196 | 8/1972 | Leinkram | 228/123 |
| 3,811,182 | 5/1974 | Ryan, Sr. et al. | 29/574 |
| 3,883,946 | 5/1975 | Dale | 228/123 X |
| 3,921,885 | 11/1975 | Knox | 228/121 X |
| 3,958,742 | 5/1976 | Howarth et al. | 228/123 |
| 3,986,251 | 10/1976 | Altemus et al. | 228/179 X |
| 4,018,374 | 4/1977 | Lee et al. | 228/121 |
| 4,078,711 | 3/1978 | Bell et al. | 228/123 |

Primary Examiner—Francis S. Husar
Assistant Examiner—K. J. Ramsey
Attorney, Agent, or Firm—Lewis B. Sternfels; W. H. MacAllister

[57] ABSTRACT

A method is described for attaching sapphire, quartz, Spinel, etc. die to gold pads in a ceramic package. Because sapphire is not directly bondable to or alloyable with gold, while silicon is, silicon is either evaporated or deposited onto the backside of a sapphire or silicon-on-sapphire wafer. After the wafer has been scribed into die, the die are attached to the gold pads in the ceramic package using a gold-silicon preform as an intermediate layer.

8 Claims, 5 Drawing Figures

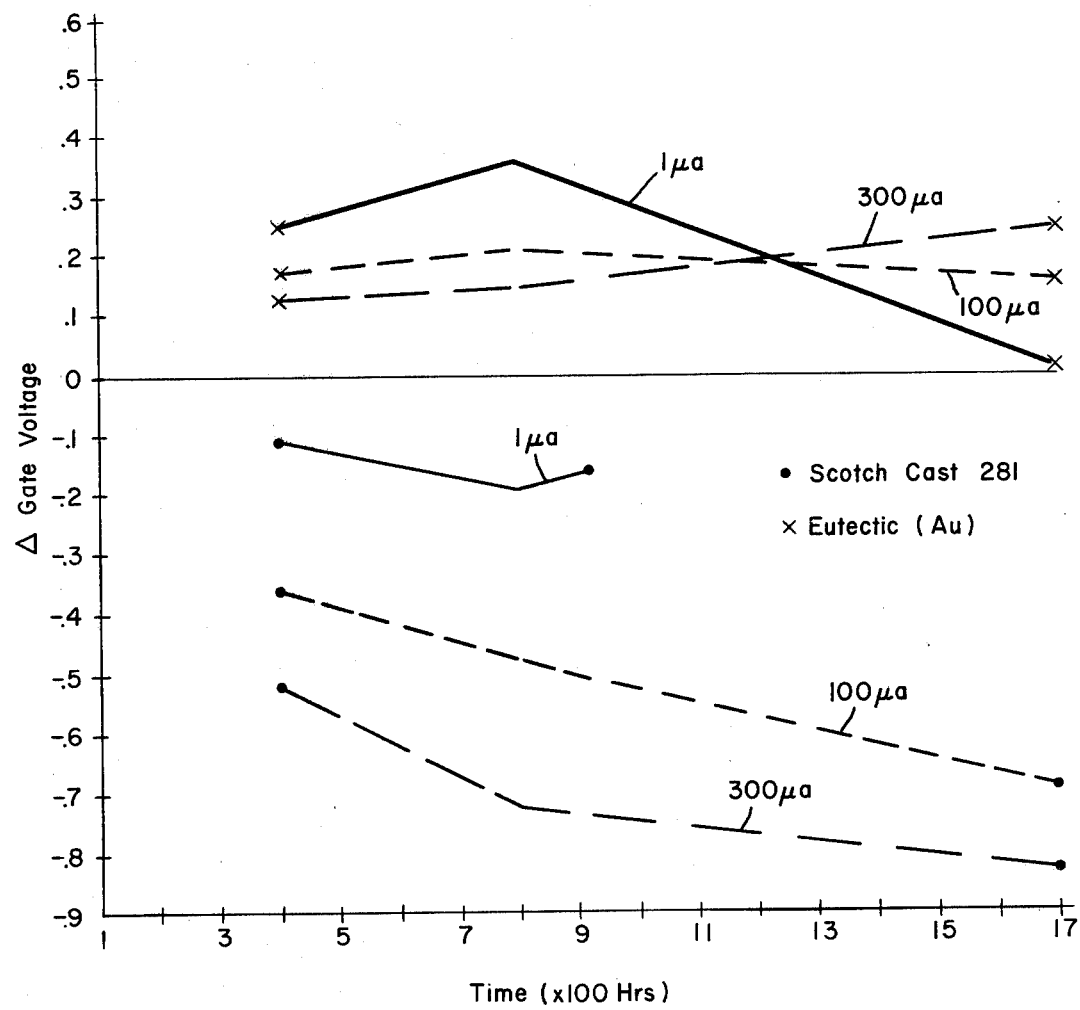

EUTECTIC DIE ATTACHMENT METHOD FOR INTEGRATED CIRCUITS

BACKGROUND OF THE INVENTION

1. Field of the Invention

The present invention relates to a method for attaching a microcircuit component to a supporting surface in which the component and the surface comprise compositions which are not readily bondable to or alloyable with each other.

2. Description of the Prior Art

Microcircuit components of the type described, such as of sapphire, quartz and Spinel, are commonly attached in a ceramic package by means of epoxy or other organic adhesive which is generally required especially for bonding of components together whose compositions do not permit their being bonded or alloyed together. Such an adhesive commonly degrades electrical performance of the electrical components over accelerated life tests. Specifically, the epoxy material exhibits out-gasing which destroys the inert atmosphere surrounding the components. Furthermore, in such life tests, the electrical parameters of the components degrade and become less stable, resulting in a shift and change in electrical values of the components.

SUMMARY OF THE INVENTION

The present invention solves or overcomes the above problems by placing matter, which is compatible with both the component and the surface to which it is to be attached, onto at least one of the components and the surface, and thereafter bonding or alloying the component and the surface together through the intermediary of the matter. For example, silicon is placed on sapphire and a die formed from the sapphire is then bonded to a gold pad by a gold-silicon preform placed between the silicon coating on the sapphire die and the gold pad.

It is, therefore, an object of the present invention to provide for a method by which incompatible attachment between components is effected.

Another object is to provide for a method which avoids the use of organic adhesives.

Another object is to provide for a method which does not result in degradation in the use or electrical characteristics of the devices to be attached.

Another object is to provide for a method by which components may be easily attached without the application of undue heat.

Other aims and objects as well as a more complete understanding of the present invention will appear from the following explanation of an exemplary embodiment and the accompaning drawings thereof.

BRIEF DESCRIPTION OF THE DRAWINGS

FIGS. 2-5 are graphs depicting the cumulative results of N-channel (FIGS. 2 and 3) and P-channel (FIGS. 4 and 5) electrical life tests at 150° C. biased at −10 V (FIGS. 2 and 4) and at −10 V (FIGS. 3 and 5) on the silicon gate as between a commonly used organic adhesive and the bonding means of the present invention.

DESCRIPTION OF THE PREFERRED EMBODIMENTS

Figure 1:
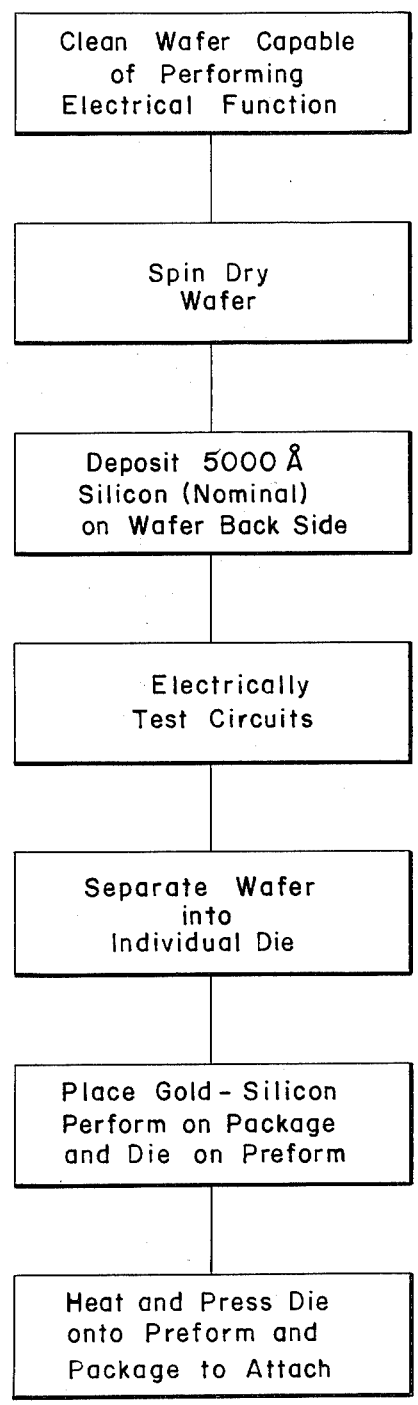
FIG. 1 is a flow diagram illustrating the method of the present invention.
Figure 2:
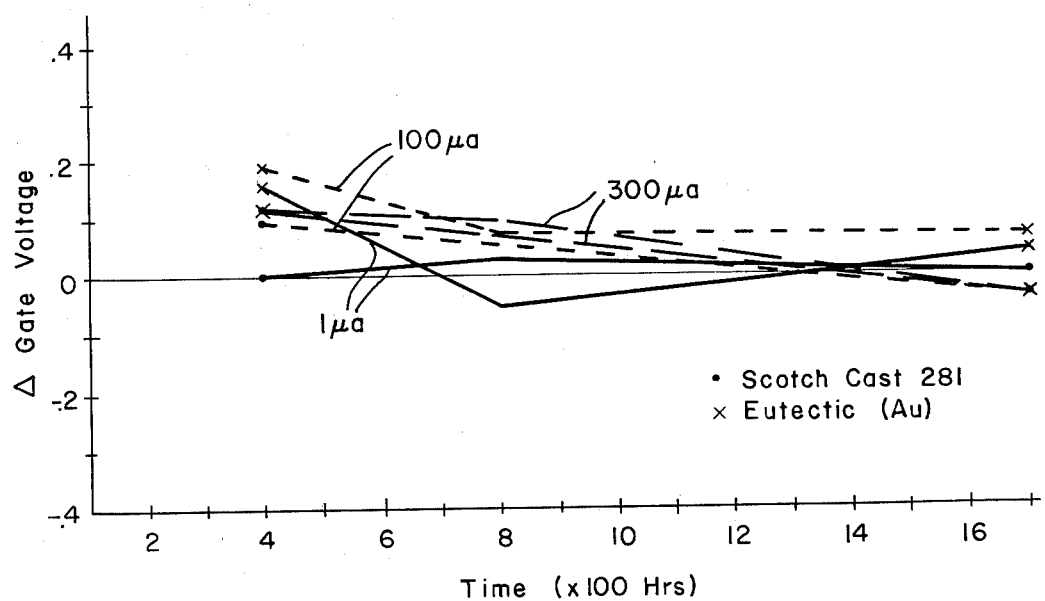
Figure 3:
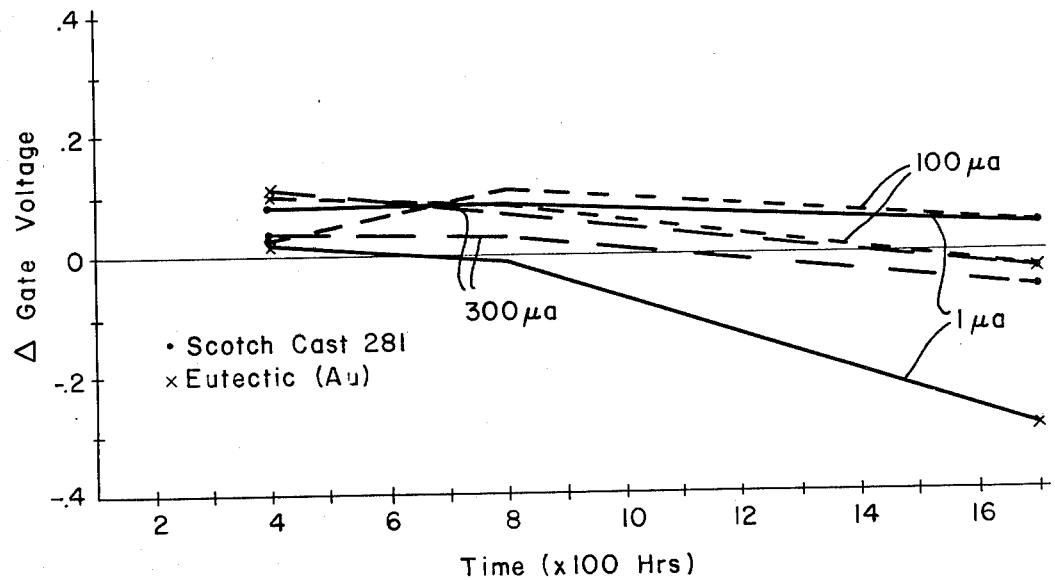
Figure 4:
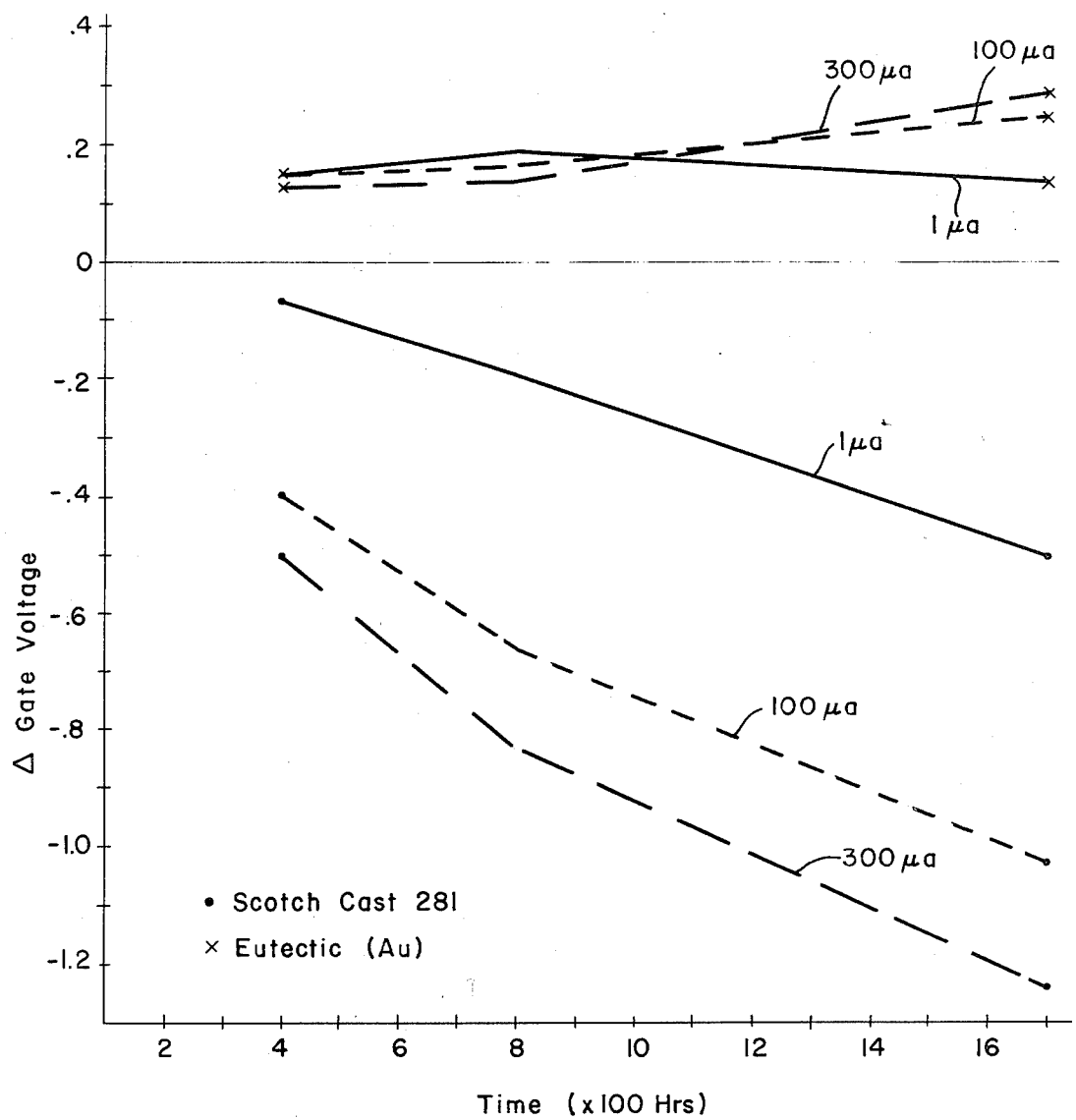

As shown in FIG. 1, a processed wafer, such as of sapphire, quartz or Spinel which is capable of forming an electronic function, is the starting point of the present invention. Such a wafer has been processed so that the last industry step of placing a passivation layer thereon has been completed. Such a wafer typically comprises a multiplicity of electrical circuits having pads on a surface of the wafer for its interconnection into some electrical function. Such electrical circuits are individually placed so that the wafer may be later cut into individual die, with each die comprising one or more of the electrical circuits.

Such a wafer, such as described above, may comprise sapphire, quartz, Spinel, silicon-on-sapphire, etc. While the method of the present invention was developed specifically for sapphire, it is useful for any material which is not easily bondable to or alloyable with gold.

The first step of the present method is to clean the wafer sufficient to remove foreign materials and any residue therefrom, followed by a rinse in deionized water. Thereafter, the cleansed wafer is dried, such as by spin drying it in a nitrogen atmosphere.

Silicon is then placed on the backside of the wafer. This backside is opposite from that surface of the wafer through which the electrical circuits terminate in pads. The backside may be ground or polished, both characteristics already existing on the wafer as received from the manufacturer thereof. Various methods of placing silicon on the backside may be used.

Preferably, an electron beam evaporator, e.g. a planetary evaporator, is used to evaporate silicon onto the backside without heating of the substrate. In general, it is preferred to deposit silicon in excess of 5,000 Angstroms. The thickness is not critical but a 5,000 Angstrom deposit has been found to be acceptable in meeting military specifications; nevertheless, lesser thicknesses do not render the invention inoperable or impractical. Other techniques of silicon placement on the backside include deposition and ion beam sputtering.

After the silicon has been placed on the backside of the wafer, the wafer is electrically tested to see which die, prior to their being cut, on the wafer are electrically good and such good die are accordingly marked.

The wafer is then separated into individual die by any conventional manner such as by diamond scribing, diamond sawing, laser cutting, and the like. Thereafter, the individual die are broken at the scored lines.

The die, as well as the package into which the die are to be bonded, are then cleaned. Water followed by trichloroethylene is useful for this purpose. Following cleaning, the die and the package are dried. Such a package is commonly formed of ceramic; however, other materials are acceptable.

For the bonding operation, the package is placed on a heated chuck in a nitrogen atmosphere at approximately 400° C. A gold-silicon preform is then placed on the package at appropriate places and the preform is melted in the heat. The die is then placed on the preform and pressed to obtain a uniform gold-silicon alloying bond.

Thereafter, the package is processed into a final configuration, including lid sealing, etc.

A series of quality assurance tests were performed on a group of CMOS/SOS die to determine the integrity of the present invention vis-a-vis the commonly used organic adhesive. The particular organic adhesive used was an epoxy known by its trade name as Scotch Cast 281. This adhesive was selected because it is one of the better epoxy adhesives on the market. The test vehicle used was a particular silicon gate circuit package in a 14-pin DIP. This circuit comprised a 256 bit shift register and a set of N and P-channel test devices. Selected die were bonded and used to determine the mechanical integrity of both the wire bonds (ultra-sonic) and the die attach techniques.

One wafer bonded with the Scotch Cast 281 epoxy from a particular lot was used to determine the quality of the epoxy. As comparison, one micron of silicon was evaporated on the backside of one wafer from the same lot to facilitate eutectic die attaching. The technique used to die attach the sample is described as above.

The following sequence of tests were performed on packaged devices with the following results. Leak tests, prior to and after stabilization bake, thermal shock, thermal cycling, and constant acceleration tests, indicated no leak test failures. An end point electrical test showed that all bonds were intact with no degradation of the device characteristics. The results of bond pull and die shear tests are listed below in the following table.

TABLE I

| BOND PULL/DIE SHEAR | | |
|---|---|---|
| Package | Bond Pull (grs)* | Shear (grs) |
| (Eutectic die attach) | | |
| 1 | 2.44±.64 | >4000 |
| 2 | 2.58±.95 | >4000 |
| 3 | 3.24±.65 | 3300 |
| 4 | 2.90±.49 | >4000 |
| 5 | 2.56±.34 | 3800 |
| 6 | 2.64±.77 | 3300 |
| 7 | 2.60±.46 | >4000 |
| 8 | 2.44±.51 | >4000 |
| 9 | 2.96±.62 | >4000 |
| (Scotch Cast 281) | | |
| 10 | 2.90±.48 | >4000 |
| 11 | 3.08±1.20 | >4000 |
| 12 | 3.46±.99 | >4000 |
| 13 | 2.96±.68 | >4000 |
| 14 | 3.20±.64 | >4000 |
| 15 | 2.62±.26 | >4000 |
| 16 | 2.74±.60 | >4000 |
| 17 | 2.94±.89 | >4000 |
| 18 | 3.10±.30 | >4000 |

65.5% of the bonds broke at the package bond
34.5% of the bonds broke at the die bond Another series of tests also involved the comparison between P and N-channel devices which were attached using Scotch Cast 281 epoxy and eutectic gold die attached according to the present invention. These tests subjected the devices to a 150° C. and ±10 V biased life test. The results of these tests are shown in FIGS. 2-5, in which the devices were tested after 0, 400, 800 and 1700 hours under bias at 150° C. In these tests, the gate voltages required for current levels of 1 microampere, 100 microamperes, and 300 microamperes were measured. Each data point in the figures represents the average of four measured values. These figures show how much variation of the gate voltage from an initial point occurs over a period of time and the test results indicate that the present invention is at least equal to and in many cases better than the results obtained from the indicated organic adhesive.

Although the invention has been described with a reference to a particular embodiment thereof, it should be realized that various changes and modifications may be made therein without departing from the spirit and scope of the invention.

What is claimed is:

1. A method for attaching a die to a microcircuit supporting surface, in which the die comprises one of sapphire, silicon-on-sapphire, quartz and Spinel material and the surface comprises gold material which materials are not readily bondable and alloyable to and with each other, comprising the steps of selecting additional silicon and gold-silicon matter which are respectively adherable with the die and alloyable with the surface, placing the silicon matter on the die, and bonding the die and the surface together through the intermediary of the gold-silicon matter.

2. A method for forming and attaching a die to a surface in a microcircuit package comprising the steps of:

cleaning a processed integrated circuit wafer, which has a plurality of electrical circuits adjacent one surface thereof in which each circuit is capable of performing an electrical function, for removing any contaminants therefrom;

drying the cleansed wafer in an atmosphere which is non-reactive to the wafer;

placing silicon on a second surface of the wafer;

electrically testing the electrical circuits for determining the operability thereof;

separating the wafer into individual die corresponding to operable ones of the electrical circuits;

cleaning the die and the package for removing any contaminants therefrom;

heating the package in an atmosphere which is nonreactive thereto and to the die;

placing a gold-silicon preform on the package and melting the preform in the heat of said heating step; and placing the die on the preform with the silicon surface in contact therewith and pressing the die to the package for obtaining a gold-silicon alloy bond between the die and the package.

3. The method of claim 2 wherein the wafer has a composition which does not readily bond to and is not readily alloyable with gold.

4. The method of claim 3 wherein the wafer composition is sapphire, quartz or Spinel material.

5. The method of claim 2 wherein said silicon placing step comprises the step of evaporating the silicon on the second surface to an approximate thickness of 5000 Angstoms.

6. The method of claim 2 wherein said silicon placing step comprises one of evaporating, vapor depositing or sputtering the silicon on the second surface.

7. The method of claim 2 wherein said package heating, preform melting and bond-alloying steps comprise the steps of heating the package and the preform to approximately 400° C. in a nitrogen atmosphere.

8. A method for attaching sapphire to a gold pad in a ceramic package comprising the steps of placing silicon onto the ground backside of a silicon-on-sapphire wafer, separating the wafer into die, and attaching the die to the gold pad through the intermediary of a gold-silicon preform.

* * * * *